United States Patent [19]
Cappuzzo et al.

[11] Patent Number: 5,907,791
[45] Date of Patent: May 25, 1999

[54] METHOD OF MAKING SEMICONDUCTOR DEVICES BY PATTERNING A WAFER HAVING A NON-PLANAR SURFACE

[75] Inventors: Mark Anthony Cappuzzo; Casey Francis Kane, both of Linden; Joseph Shmulovich, Murray Hill, all of N.J.

[73] Assignee: Lucent Technologies Inc., Murray Hill, N.J.

[21] Appl. No.: 08/637,986

[22] Filed: Apr. 25, 1996

[51] Int. Cl.⁶ .................................................. H01L 21/44
[52] U.S. Cl. ......................... 438/669; 438/666; 438/637; 438/640; 438/652; 438/653; 438/656; 438/671
[58] Field of Search .................................. 438/669, 666, 438/637, 640, 652, 653, 656, 671

[56] References Cited

U.S. PATENT DOCUMENTS

| | | | |
|---|---|---|---|
| 4,985,116 | 1/1991 | Mettler et al. | 430/313 |
| 5,013,948 | 5/1991 | Tumpey et al. | 257/909 |
| 5,236,552 | 8/1993 | Fang | 430/329 |
| 5,288,377 | 2/1994 | Johnson et al. | 430/256 |
| 5,336,905 | 8/1994 | Bosman et al. | 257/54 |
| 5,366,906 | 11/1994 | Wojnarowski et al. | 438/598 |
| 5,407,788 | 4/1995 | Fang | 430/318 |
| 5,518,964 | 5/1996 | DiStefano et al. | 438/126 |
| 5,578,526 | 11/1996 | Akram et al. | 438/613 |

OTHER PUBLICATIONS

J. West, "Electrodeposited Photoresists", Jun. 1991, pp. 44–48, PC FAB.

Shmulovich et al., "successful development of non–planar lithography for micro–machining applications", Summaries of the Papers to be Presented a the Topica, Integrated Photonics Research. 1996 Technical Digest Series & Proceedings of Integrated Photonics, vol. 6, pp. 354–367, Apr. 29, 1996 to May 2, 1996.

Vidusek, "Electrophoretic photoresist technology: an image of the future today",Circuit World, vol. 15, No.2, UK, pp. 6–10, Jan. 1989.

*Primary Examiner*—John F. Niebling
*Assistant Examiner*—Lynne A. Gurley

[57] ABSTRACT

In accordance with a specific deposition/etching sequence, a multi-layer metallization system is formed on the non-planar top surface of a semiconductor wafer. In an electrophoretic deposition step, a conformal uniform-thickness layer of a resist material is then formed on the top surface of the metallization system. In turn, the layer of resist material is lithographically patterned to provide an etch-mask for defining features in the underlying metallization system.

14 Claims, 5 Drawing Sheets

METHOD OF MAKING SEMICONDUCTOR DEVICES BY PATTERNING A WAFER HAVING A NON-PLANAR SURFACE

BACKGROUND OF THE INVENTION

This invention relates to the fabrication of semiconductor devices and, more particularly, to a method for patterning the non-planar surface of a semiconductor wafer on which devices are to be made.

For a variety of applications of practical importance, it is necessary that a substrate having a non-planar surface topology be lithographically processed to define patterns on the surface of the wafer. Thus, for example, for making devices for use in an optical communication system, it may be necessary to define patterns on a semiconductor wafer having v-shaped grooves formed in its surface. In particular, patterns may have to be defined simultaneously both in the v-grooves and on adjacent planar portions of the wafer surface.

It is well known that considerable difficulties are associated with utilizing conventionally spun-on resists for patterning non-planar wafer surfaces. In particular, the presence of v-grooves in such a surface presents an overall wafer topology that cannot be uniformly coated with standard spin-on resist technology. In practice, a spun-on resist tends to form a coating along the edges of such grooves that is thin relative to some prescribed nominal coating thickness, while forming a considerably thicker-than-prescribed coating in low-lying areas of the grooves.

The aforedescribed non-uniform distribution of spun-on resist over the surface of a wafer containing v-grooves is clearly undesireable. The inevitable result of such non-uniform distribution is that it is difficult, if not impossible, in a wafer processing sequence to lithographically achieve well-defined and consistent resist patterns simultaneously both in the grooves and on adjacent planar surface portions of the wafer.

Accordingly, considerable efforts have been directed by workers skilled in the art aimed at trying to devise semiconductor device fabrication sequences, including resist-based lithographic steps, suitable for forming small-feature-size patterns on the non-planar surfaces of semiconductor wafers. It was recognized that these efforts, if successful, could improve the yield, lower the cost, and improve the performance and reliability of semiconductor devices whose manufacture on non-planar wafer surfaces has heretofore been considered exceedingly difficult and complicated.

SUMMARY OF THE INVENTION

In accordance with the principles of the present invention, a layer of silicon dioxide formed on the non-planar surface of a semiconductor wafer is partially etched before depositing a multi-layer metallization system on the layer The metallization is then coated with a layer of resist material in an electrophoretic deposition step. A uniform-thickness layer of resist is thereby deposited on the non-planar surface. The layer of resist thus formed provides a basis for patterning the metallization in accordance with various semiconductor device processing techniques.

Also, in accord with the invention, a multi-layer metallization system is formed on the non-planar v-grooved surface of a semiconductor wafer by a specific deposition/etching sequence. The metallization is then electrically plated with a uniform-thickness layer of an electrophoretic photoresist. The photoresist is then patterned by lithographic techniques to provide a mask for subsequent processing of the underlying metal layers. In this way, well-defined conductive patterns can be formed simultaneously both in the v-grooves and on planar surfaces of the wafer.

BRIEF DESCRIPTION OF THE DRAWING

A complete understanding of the present invention and of the above and other features and advantages thereof will be apparent from the detailed description below taken in conjunction with the accompanying drawing, not drawn to scale, in which.

DETAILED DESCRIPTION

Figure 1:
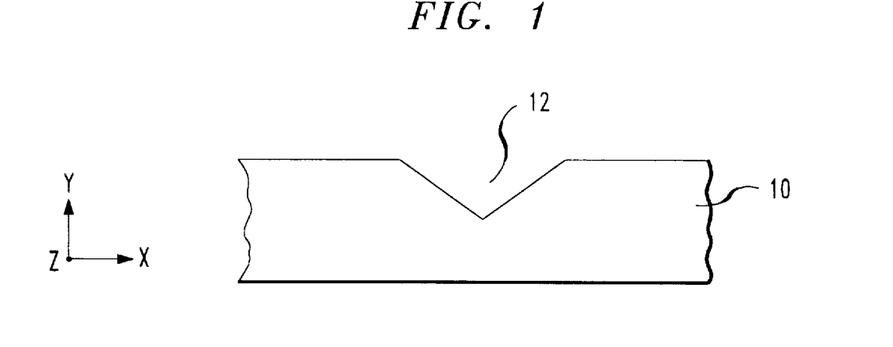
FIG. 1 is a cross-sectional depiction of a portion of a semiconductor wafer that has a v-groove formed in the top surface thereof, FIG. 2 illustratively represents, in a generic fashion, layers formed on the top surface of the FIG. 1 structure.

By way of a particular illustrative example, FIG. 1 shows a portion of a substrate that comprises, for instance, a conventional semiconductor wafer 10. The wafer 10, which is depicted as having a non-planar top surface, is, for example, made of monocrystalline<100>silicon, has a diameter of approximately 12.7 centimeters (cm) and a thickness or Y-direction dimension of about 508 micrometers ($\mu$m).

Illustratively, for use in an optical communication system, the wafer 10 of FIG. 1 is shown as having a v-groove 12 formed in the top surface thereof. Such a groove is utilized, for example, for holding a section of optical fiber, as is well known in the art. For one such particular application, the width or X-direction extent of the groove 12 is about 272 $\mu$m, and the depth or Y-direction extent of the groove 12 is approximately 150 $\mu$m.

In practice, the wafer 10 of FIG. 1 may contain a multitude of grooves. Some of these grooves are utilized, for example, to hold optical fiber sections, as mentioned above. Other v-grooves, typically having shorter Z-direction extents, are often employed to retain standard ball-type lens elements. By means of such a lens element, light emanating from an associated laser device can be directed into an input end of a retained fiber section, while light from the output end of a retained fiber can be directed via such a lens element to an associated photodetector device. Illustratively, these associated devices are formed in integrated-circuit form on planar portions of the top surface of the wafer 10. For establishing electrical connections to these devices, microminiature metallic contact pads must be defined on the planar portions of the wafer.

Additionally, it is often necessary in practice to define patterns on the slanted surfaces of the v-grooves formed in the wafer 10 of FIG. 1. Thus, for example, in some applications metallic mirrors are formed in the v-grooves to assist in routing light signals into or out of the ends of fiber sections held in the grooves.

In accordance with one specific aspect of the present invention, a multi-layer metallization system in which the aforementioned contact pads and mirrors are to be defined is deposited on the entire top surface of a wafer having a non-planar surface topology. Thereafter, in further accord with the invention, the entirety of the non-planar top surface of the multi-layer system is overlaid with a uniform-thickness conformal coating of an electrophoretic resist material. In turn, the uniform-thickness resist coating provides a basis for precisely defining patterns by lithographic techniques both on planar (that is, lying in the X–Z plane represented in FIG. 1) and non-planar portions of the wafer.

In one specific fabrication sequence that is illustrative of the principles of the present invention, a layer of silicon dioxide ($SiO_2$) is initially grown on the entire top non-planar surface of the silicon wafer 10 represented in FIG. 1. By way of example, this is done in a standard high-pressure-oxidation (HIPOX) growth step in which, for instance, an $SiO_2$ layer 14 (FIG. 2) having a thickness of about ten $\mu$m is formed on both planar and slanted portions of the top surface of the wafer.

In practice, it is often observed that $SiO_2$ grown in the indicated manner exhibits extremely narrow regions at the bottoms of v-grooves formed in a wafer. It is very difficult to reliably cover such narrow regions with a subsequently deposited metallization system.

Figure 2:
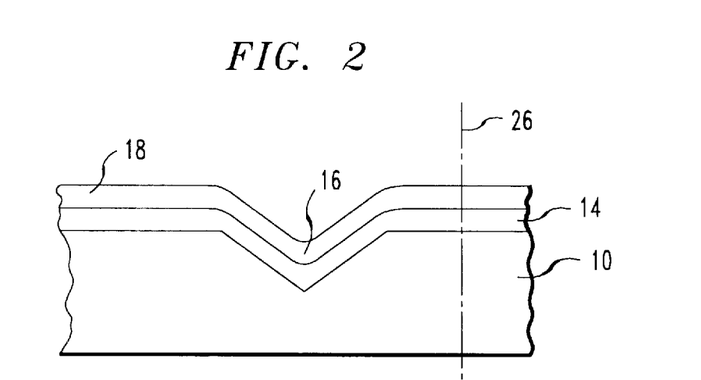

Accordingly, to improve metal coverage at the bottoms of such v-grooves, it has been found to be advantageous to etch the grown $SiO_2$ layer 14 before commencing metal deposition. Illustratively, this is done in a conventional etching step, utilizing, for example, a 7:1 buffered oxide etchant comprising seven parts by volume of ammonium flouride-to-one part by volume of a hydrofluoric acid (HF) solution that includes 49% by weight HF and 51% by weight water ($H_2O$). Etching is typically carried out for approximately five minutes. As a result of the aforedescribed etching step, about 0.5-to-1.0 $\mu$m of HIPOX is removed from the layer 14. Also, significantly, the bottoms of v-grooves are rounded and slightly widened during the etching step. This result is illustrated in FIG. 2 where the layer 14 is shown as having a rounded portion 16 at the bottom of the indicated groove. As noted above, reliable coverage of the entirety of the $SiO_2$ layer 14 with subsequently deposited metal layers is thereby made more certain.

Various metallization systems are used in integrated-circuit devices and assemblies to form conductive contact pads and other elements such as mirrors. One advantageous such system, and the illustrative one to which particular attention is directed herein, comprises a conventional four-layer system that typically includes, from bottom to top, succesive layers of titanium (Ti), titanium nitride (TiN), platinum (Pt) and gold (Au).

In accordance with one specific aspect of the present invention, contact pads and mirrors each patterned from such an illustrative four-layer metallization system are formed on a non-planar wafer surface by initially depositing on the $SiO_2$ layer 14 of FIG. 2 five successive layers of metal. (The upper two layers, made respectively of Ti and TiN, will subsequently be removed and replaced by a layer of Au, as described in detail later below.) So as not to unduly clutter FIG. 2, such an illustrative five-layer metallization system is schematically represented therein by a single layer 18.

Figure 3:
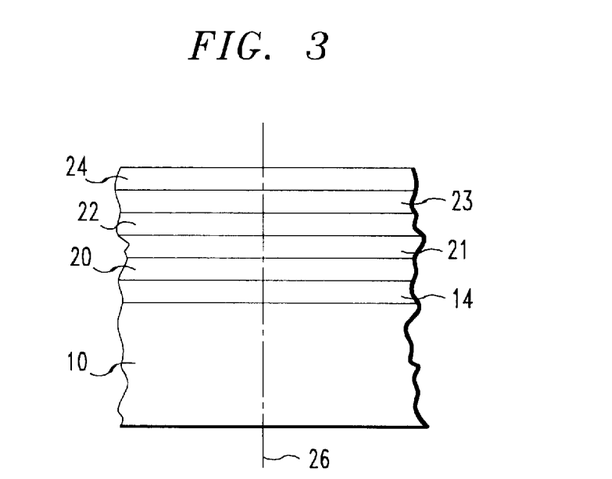
FIG. 3 depicts in more detail a portion of the layers shown in FIG. 2.

In FIG. 3, the actual multi-layer nature of the layer 18 of FIG. 2 is explicitly indicated. In particular, FIG. 3 shows a metallization system comprising five layers 20 through 24 deposited on the $SiO_2$ layer 14 on a planar portion of the FIG. 2 structure in the immediate vicinity of reference line 26 of FIG. 2. Illustratively, the layers 20 through 24 of FIG. 3 are deposited in sequence by standard sputtering techniques in a single run.

The metallization system including the layers 20 through 24 shown in FIG. 3 comprises, for example, from bottom to top, a 100-nanometer (nm)-thick layer 20 of Ti, a 25-nm-thick layer 21 of TiN, a 200-nm-thick layer 22 of Pt, a 25-nm-thick sacrificial layer 23 of TiN, and a 100-nm-thick sacrificial layer 24 of Ti. The entire top surface of the depicted wafer, including both planar and slanted surfaces, is thereby conformally covered by a continuous conductive coating comprising the aforespecified five layers (including the sacrificial layers 23 and 24).

After being patterned, the upper Ti layer 24 of FIG. 3 will be used as a mask for etching the underlying Pt layer 22. The upper TiN layer 23 serves as a barrier to prevent the Ti layer 24 from interacting with the Pt layer 22. Without the layer 23, Ti from the layer 24 would diffuse into the layer 22 and subsequently prevent the masking Ti layer 24 from being cleanly stripped away from the surface of the Pt layer 22.

Prior to depositing the Ti layer 20 (FIG. 3) on the $SiO_2$ layer 14, it is advantageous to clean the top surface of the layer 14. Illustratively, this is done in a standard argon(Ar)/nitrogen($N_2$) sputter-etching step. This typically enhances the adhesion of the layer 20 to the underlying layer 14.

In further accord with the herein-described inventive procedure, deleterious pin-holes in the Ti masking layer 24 (FIG. 3) are avoided by interspersing sputter-etching steps in the overall deposition sequence. Thus, for example, after depositing the TiN layer 21, its surface is advantageously sputter etched for about five minutes at a pressure of approximately ten $\mu$m and at a power of about 0.5 kilowatts, utilizing argon or an argon/nitrogen gas mixture. Similar sputter-etching steps are respectively carried out after depositing each of the Pt layer 22 and the TiN layer 23. By following this sequential deposition/etching procedure, a thin pin-hole-free Ti layer 24 is consistently achieved both on planar surfaces and on slanted surfaces of the depicted wafer.

In accordance with the principles of the present invention, a wafer having a multi-layer metallization system conformally deposited on the entire top non-planar surface thereof is then coated with a uniform-thickness layer of a resist material. Such a deposition step is carried out, for example, in a quartz tank 26 (FIG. 4) which contains a resist solution 28. Illustratively, the solution in the tank 26 comprises a conventional commercially available electrophoretic photoresist such as Eagle 2100 ED Photoresist (a so-called negative photoresist) made by Shipley Co., Newton, MA.

Figure 4:
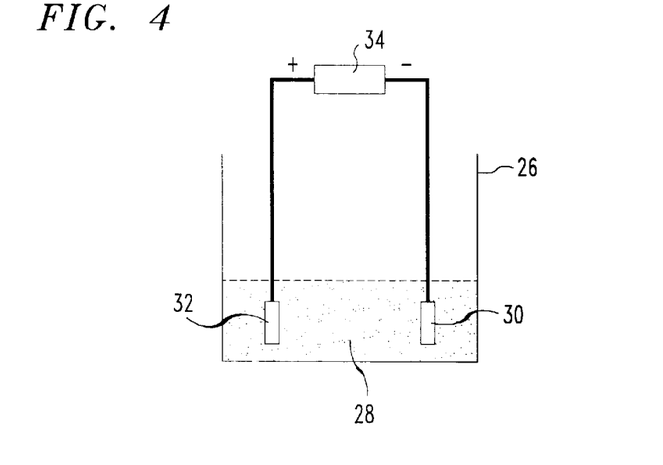
FIG. 4 is a schematic depiction of the manner in which a wafer of the type represented in FIGS. 1 through 3 is coated with a layer of an electrophoretic resist material in accordance with the principles of the present invention.

In one particular exemplary case, the resist solution 28 in the tank 26 of FIG. 4 comprises one part by volume Eagle 2100 ED Photoresist-to-two parts by volume water ($H_2O$). The solution 28 is advantageously maintained at a temperature of about 37 degrees Celsius. A metal-coated wafer 30 to be plated with photoresist is placed in the solution 28. Another metal-coated wafer 32 is immersed in the solution 28 to serve as a counter-electrode during the resist-coating process. By way of example, the wafer 30 (FIG. 4) to be coated with resist is connected to the negative terminal of a direct-current power supply unit 34, and the counter-electrode 32 is connected to the positive terminal of the unit 34. Illustratively, the unit 34 supplies a direct-current voltage of about 110 volts.

In practice, in order to produce uniform-thickness resist coatings, it has been found to be advantageous to thoroughly wet the metallized surface of the wafer to be coated with resist before connecting the wafer to the power supply 34 of FIG. 4. For a wafer not having Au as the top layer of its initial metallization system (that is, for example, for a five-layer system such as that described above and represented in FIG. 3), the surface to be coated can be adequately wetted by successively submerging and withdrawing the wafer from the resist solution 28 at least five times. For a wafer whose initial metallization system includes Au as its top layer (such a system will be described in detail later below), the wafer is wetted by, for example, soaking it in $H_2O$ for about ten minutes and then successively submerging and withdrawing it from the resist solution 28 approximately ten times.

After the metallized surface of the wafer to be coated has been wetted with resist solution, the wafer is suspended in the solution 28 depicted in FIG. 4. The wafer 30 and its counter-electrode 32 are positioned in the solution 28 such that the metallized surfaces face each other. Illustratively, the facing surfaces are positioned about 7.5 cm apart.

With the electrodes 30 and 32 of FIG. 4 positioned as described above, the power supply 34 is then turned on. For an applied direct-current voltage of 110 volts, and under the particular illustrative processing conditions specified herein, a uniform thickness 5.5-$\mu$m-thick layer of photoresist is thereby conformally deposited on the entirety of the non-planar metallized surface of the wafer 30 in approximately five seconds.

Figure 5:
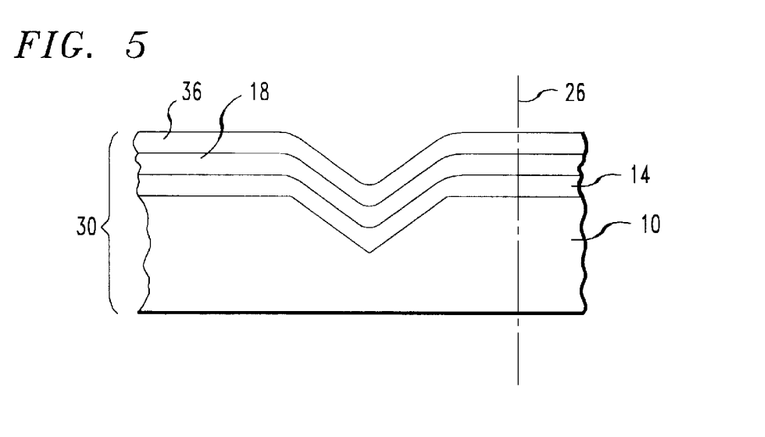
FIG. 5 shows a portion of a wafer coated with a uniform-thickness layer of electrophoretic resist in the manner represented in FIG. 4.

After turning off the power supply 34 and removing the wafer 30 from the resist solution 28, the wafer is typically rinsed in deionized water and then spin dried. At that point, the resist-coated wafer 30 appears as represented in FIG. 5. (FIG. 5 is the same as FIG. 2, with a top-most resist layer 36 added thereto.) Subsequently, the wafer 30 of FIG. 5, having the uniform-thickness layer 36 of negative photoresist thereon, is lithographically processed to define prescribed patterns in the aforespecified underling metallization system.

For non-planar wafer surface topologies of the particular illustrative type described herein, it is generally advantageous not to soft-bake the aforespecified photoresist coating 36 shown in FIG. 5. (Soft-baking is commonly employed in most conventional photoresist processing sequences.) Soft-baking is avoided because even at relatively low temperatures (for example, at as low as about 60 degrees Celsius), it has been observed that such soft-baking can cause the resist coating to flow down the slanted sides of the noted v-grooves. In turn, this flow often has the deleterious result of leaving portions of the v-groove surfaces devoid of resist. But, significantly, when the exposed resist coating is later baked, and even if the coating had not priorly been soft-baked before exposure, no subsequent flow of the exposed resist is observed to occur in the v-grooves even when the wafer is heat-treated at temperatures up to about 180 degrees Celsius.

In accordance with standard lithographic practices, the illustrative resist layer 36 described above and shown in FIG. 5 is then selectively exposed to light (or to electrons, X-rays, etc. if other types of known electrodeposited resist materials sensitive to these alternative types of radiation are employed). For a negative photoresist material, the resist portions exposed to light are cross-linked and thereby rendered relatively insoluble. As a result, when the selectively exposed resist is subsequently developed, non-cross-linked portions of the resist layer 36 are washed away. Accordingly, a prescribed pattern comprising, for example, resist portions 38 and 40 is formed in the layer 36, as represented in FIG. 6.

For the illustrative aforespecified Eagle 2100 ED Photoresist, exposure energies of about 150-to-200 milli-Joules are generally adequate to define prescribed patterns in the resist layer 36 of FIG. 5. After being selectively exposed, the photoresist layer 36 is developed. An advantageous developer for this particular photoresist is, for example, Eagle 2005 Developer, which is also commercially available from Shipley Co. In practice, the developing solution utilized to remove non-cross-linked portions of the selectively exposed photoresist comprises one part by volume Eagle 2005 Developer-to-twenty parts by volume of deionized water. During development, the solution is, for example, heated to about forty degrees Celsius and constantly mixed with a conventional spin bar. A developing time of approximately 1.5 minutes is generally sufficient to clear unexposed resist from the entirety of the non-planar wafer surface. Subsequently, the wafer is typically rinsed with deionized water by, for example, repetitively submerging and withdrawing the wafer from a tank of deionized water about 25-to-30 times.

During development, the bottom edges of exposed resist portions remaining on the top Ti layer 24 sometimes lift slightly. If this is observed, it is advantageous to bake the patterned resist at, for example, about 130 degrees Celsius for approximately thirty minutes in a convection oven. Such heating causes the resist material to flow slightly, thereby causing any lifted edges of the resist pattern to readhere to the top surface of the Ti layer 24. Following such baking, the wafer is typically given a conventional oxygen-plasma descum for about two minutes, at, for example, a pressure of approximately one Torr and at a power of about 100 Watts. Such cleaning ensures that all unexposed (non-cross-linked) resist material is cleared from surface portions of the Ti layer 24.

Figure 6:
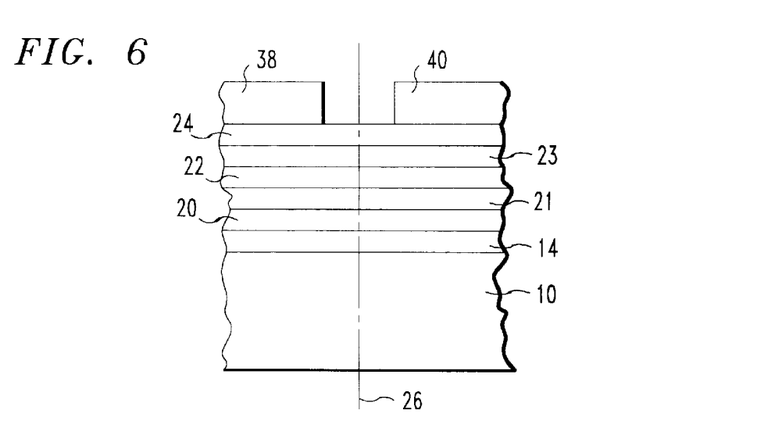
FIGS. 6 through 13 successively show the resist-coated wafer of FIG. 5 at various subsequent steps of an illustrative device fabrication sequence.

Next, the wafer surface represented in FIG. 6 is etched in accordance with an illustrative wet-etching process sequence. In the first step of this sequence, exposed portions of the Ti layer 24 that are not covered with protective portions of the resist mask are removed. For example, this is done by subjecting the exposed metal to a standard wet etchant for Ti (for example, 100 parts by volume $H_2O$-to-one part by volume of an HF solution comprising 49% by weight HF and 51% by weight $H_2O$). In practice, exposed portions of a 100-nm-thick Ti layer are thereby removed in about one minute. At that point, the structure being processed appears as indicated in FIG. 7, where reference numerals 42 and 44 represent portions of the resulting Ti pattern.

Figure 7:
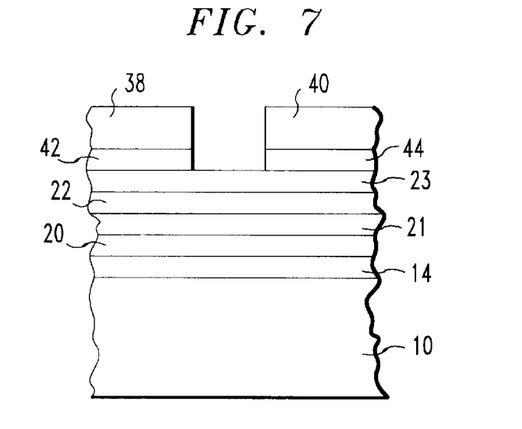

Subsequently, the cross-linked portions of the patterned resist layer, such as the portions 38 and 40 shown in FIG. 7, are removed in a conventional stripping step. For the particular illustrative photoresist specified earlier above, this is done, for example, in a solution consisting of commercially available Eagle 2009 Remover made by the Shipley Co. As a result, only a patterned Ti layer then remains on the top surface of the TiN layer 23 of FIG. 7. This patterned Ti layer, which includes the portions 42 and 44 shown in FIG. 7, will serve as an etch mask during subsequent processing.

Figure 8:
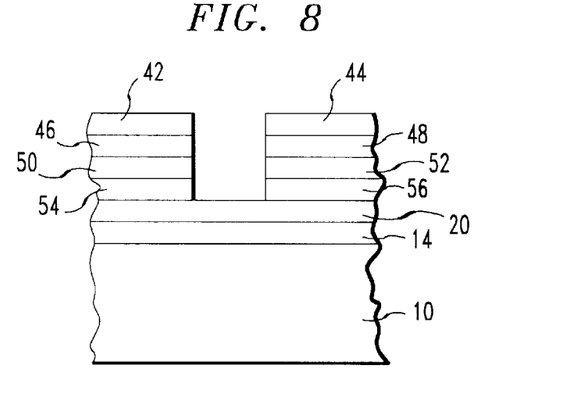

Next, utilizing the aforementioned Ti pattern as a mask, underlying TiN and Pt layers of the structure represented in FIG. 7 are selectively etched. Illustratively, this is done in a standard aqua regia solution [for example, four parts by volume $H_2O$-to-three parts by volume hydrochloric acid (HCl)-to-one part by volume nitric acid ($HNO_3$)] at about 90 degrees Celsius for approximately three minutes. The selectively etched strucure then appears as shown in FIG. 8, where the portions 42 and 44 represent parts of the Ti mask layer, portions 46 and 48 represent remaining parts of the etched TiN layer 23, portions 50 and 52 represent remaining parts of the etched Pt layer 22, and portions 54 and 56 represent remaining parts of the TiN layer 21. As indicated, the pattern initially defined in the Ti mask layer is thereby transferred into the noted layers of TiN and Pt. And, during this etching step, the aforenoted Ti mask layer and the lower continuous Ti layer 20 remain virtually intact.

In further accord with the herein-described wet-etching procedure, the Ti mask portions 42 and 44 (FIG. 8), the TiN portions 46 and 48, and uncovered portions of the lower Ti layer 20 are then etched away. Illustratively, this is done by placing the wafer 10 in an etching solution comprising one part by volume hydrogen peroxide-to-three parts by volume of EDTA premix, where the EDTA premix comprises 1800 milliliters of $H_2O$, forty-five grams of EDTA (ethylene-diamine-tetra-acetic acid and disodium salt dihydroxide) and 120 milliliters of ammonia hydroxide. In about ten minutes, such an etching solution is effective to remove the indicated portions of Ti (42, 44) and TiN (46, 48) from the Pt portions 50 and 52, as well as uncovered Ti portions of the layer 20. At that point, the wafer being processed appears as represented in FIG. 9.

Figure 9:
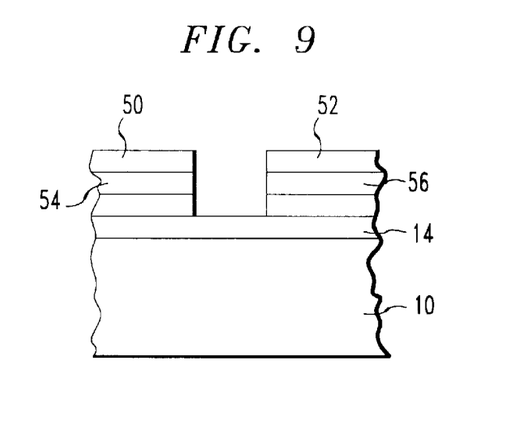
Figure 10:
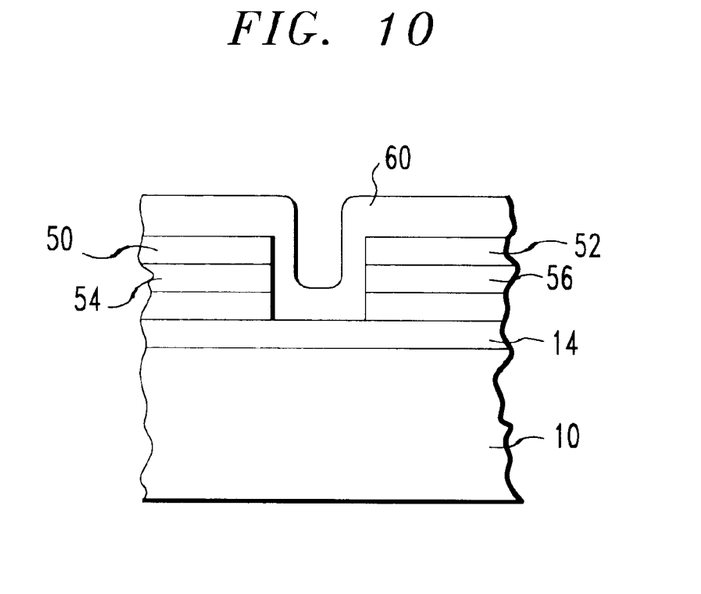
Figure 11:
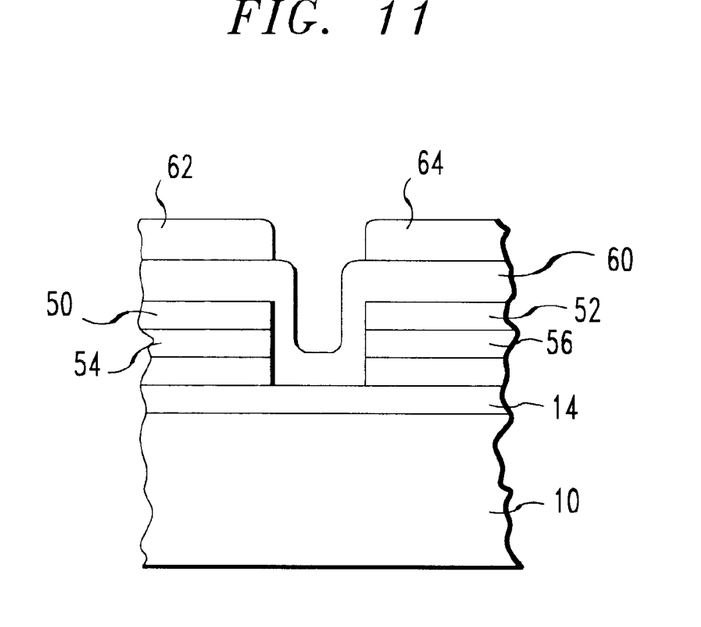

Next, the structure represented in FIG. 9 is cleaned in standard ways and then a conformal layer of Au 60 (FIG. 10) about one $\mu$m thick is sputtered onto the entire top surface thereof. Subsequently, in a second photolithographic processing sequence that comprises electrodepositing and defining features in another uniform-thickness layer of an electrophoretic resist, in the same manner described in detail earlier above, a resist pattern comprising cross-linked resist portions 62 and 64 (FIG. 11) is established on top of the Au layer 60.

Figure 12:
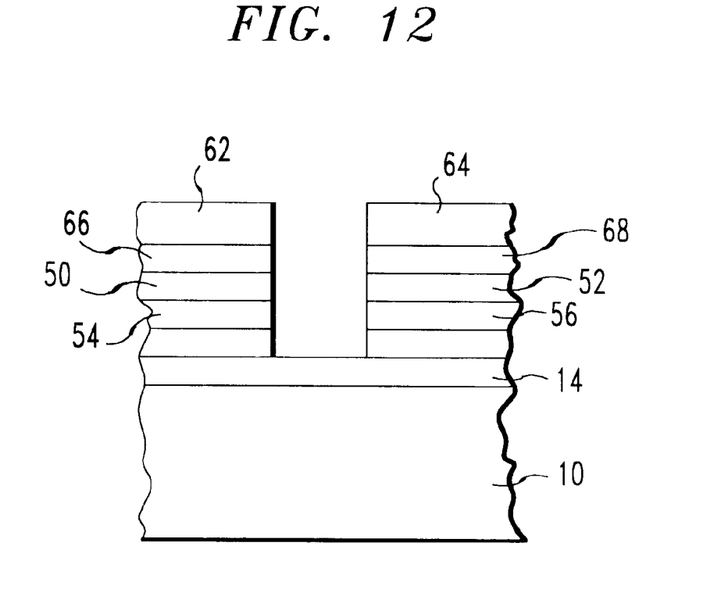
Figure 13:
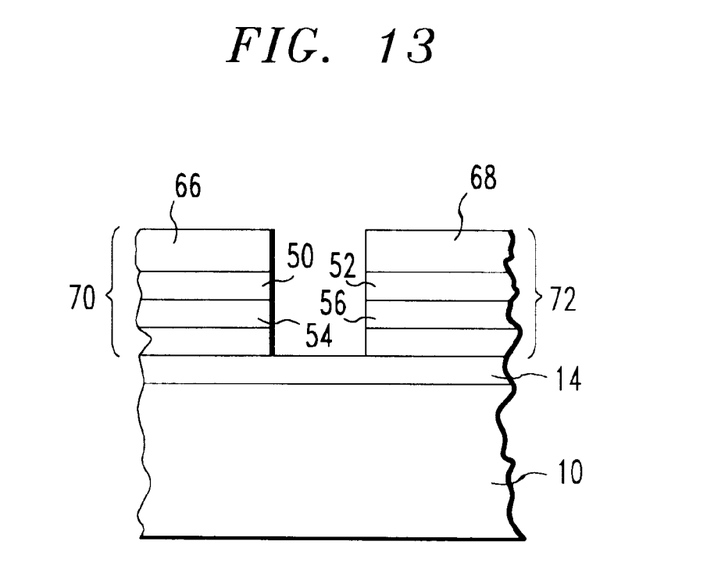

Exposed portions of the Au layer 60 that are not protected by the portions 62 and 64 of the resist mask are then removed in a wet-etching step that utilizes, for example, a dilute aqua regia solution (for instance, twelve parts by volume of $H_2O$-to-three parts by volume of HCl-to-one part by volume of $HNO_3$) at a temperature of about forty-eight degrees Celsius for approximately four minutes. At that point, the structure appears as represented in FIG. 12, where the remaining Au portions of the depicted pattern are designated by reference numerals 66 and 68. Finally, the resist portions 62 and 64 are removed, in the same standard way described earler above. The final resulting structure, shown in FIG. 13, is represented as comprising two multi-layer contact pads 70 and 72 each including, from bottom to top, layers of Ti, TiN, Pt and Au on the $SiO_2$ layer 14.

In accordance with the principles of the present invention, it is also feasible to fabricate multi-layer contact pads and other elements such as mirrors on the non-planar surface of a wafer in a processing sequence that includes a single photolithographic level. In this alternative sequence, which includes both dry- and wet-etching steps, the initially sputter-deposited metals appear as represented in FIG. 3 except that the upper Ti and TiN layers 23 and 24 of FIG. 3 are replaced with a one-$\mu$m-thick layer of sputtered Au. By the same techniques described above for electrodepositing and patterning a uniform-thickness layer of an electrophoretic resist material, a resist mask is then formed overlying the Au layer. With the patterned resist acting as an etch-mask, the wafer is then placed in a dilute solution of aqua regia (for example, of the same type as that described above) to remove exposed (unprotected) portions of the Au layer. The underlying Pt and TiN layers are then etched by standard ion-milling techniques, with the resist again acting as an etch-mask. Next, the bottom layer of Ti is etched in a standard 100:1 HF solution. After the metals have been etched, the resist material is stripped in Eagle 2009 Remover, at, for example, 85 degrees Celsius for approximately ten minutes. The resulting multi-layer patterns achieved by this alternative procedure each comprise, from bottom to top, layers of Ti, TiN, Pt and Au.

In practice, some ion-milling machines can process only a single wafer at a time. This severely limits the through-put of the overall processing sequence. Also, as a direct result of the ion-milling operation, it has been found that it is difficult to remove so-called stringers of photoresist that often remain as residue on the wafer surface after the resist-stripping step.

The wet-etching sequence described earlier above is generally more complicated than the alternative dry/wet process. In particular, the wet process requires two photolithographic levels, one to pattern the Ti/TiN/Pt structure and another to pattern the final Au layer, as specified above. Nevertheless, because of its advantageous high-throughput batch-processing characteristics, the wet-etching sequence is generally preferred to the alternative wet/dry procedure.

Finally, it is to be understood that the above-described techniques are only illustrative of the principles of the present invention. In accordance with these principles, numerous modifications and alternatives may be devised by those skilled in the art without departing from the spirit and scope of the invention. Thus, for example, although Ti was specified as the material to be used both for the top-most layer 24 (see FIG. 3) and the bottom Ti layer 20 in the aforedescribed wet-etching sequence, it is often advantageous to employ another material for the top layer. The other material to be used for the layer 24 must exhibit a differential-etch characteristic relative to Ti and must also be able to serve as an effective mask for etching underlying layers. Illustratively, chromium may be used instead of Ti for the layer 24 shown in FIG. 3. In such a case, it is then feasible to carry out the wet-etching procedure described above to form patterned TiN/Pt/Au elements on the continuous Ti layer 20. By maintaining the Ti layer 20 intact temporarily as a continuous conductive layer on the wafer 10, it is then possible to electroplate the entirety of the wafer with an electrophoretic resist and thereby provide a basis for patterning the Au-topped contact pads in another processing sequence utilizing an electro-deposited resist. In that way, for example, so-called solder dams can be photlithographically defined on the Au-topped pads. Thereafter, exposed (unmasked) portions of the continuous Ti layer 20 are removed by etching, thereby electrically isolating the contact pads from each other.

What is claimed is:

1. A method for making devices on a substrate having a non-planar top surface, said method comprising the steps of
    forming a layer of silicon dioxide on the entire top surface of said substrate,
    partially etching the entirety of said layer of silicon dioxide thereby leaving a reduced-thickness etched layer of silicon dioxide covering the entire surface of said substrate,
    forming a metallization system on the entire top surface of said partially etched layer of silicon dioxide,
    in an electrophoretic deposition step, forming a conformal uniform-thickness layer of a resist material on said metallization system,
    lithographically patterning said layer of resist material to form an etch-mask,
    and, utilizing said etch-mask made of resist material, patterning said metallization system.

2. A method as in claim 1 wherein said metallization system formed on the top surface of said substrate comprises, from bottom to top, continuous layers of titanium, titanium nitride, platinum, titanium nitride and a material selected from the group consisting of titanium and chromium.

3. A method as in claim 2 wherein said material selected from the group consisting of titanium and chromium is patterned in a wet-etching step utilizing said layer made of resist material as an etch-mask therefor to form a correspondingly patterned metallic etch-mask.

4. A method as in claim 3 wherein, utilizing said metallic etch-mask, the underlying layers of titanium nitride, platinum and titanium nitride are patterned in a wet-etching step.

5. A method as in claim 4 wherein said patterned layers of titanium and titanium nitride and unmasked portions of said continuous layer of titanium are removed in a wet-etching step, thereby leaving on said substrate defined patterns each comprising, from bottom to top, layers of titanium, titanium nitride and platinum.

6. A method as in claim 5 wherein a continuous conformal layer of gold is deposited overlying said defined patterns.

7. A method as in claim 6 wherein, in a second electrophoretic deposition step, a second uniform-thickness layer of a resist material is formed on the entire top surface of said substrate.

8. A method as in claim 7 wherein said second layer of resist material is lithographically patterned to form an etch-mask for the underlying layer of gold.

9. A method as in claim 8 wherein, utilizing the etch-mask formed from said second layer of resist material, said layer of gold is patterned in a wet-etching step, and wherein the etch-mask formed from said second layer of resist material is then removed, thereby leaving on said substrate defined conductive patterns each comprising, from bottom to top, layers of titanium, titanium nitride, platinum and gold.

10. A method as in claim 1 wherein said metallization system formed on the top surface of said partially etched layer of silicon dioxide comprises, from bottom to top, continuous layers of titanium, titanium nitride, platinum and gold.

11. A method as in claim 10 wherein, utilizing said patterned layer of resist material as an etch-mask, said gold layer is patterned in a wet-etching step.

12. A method as in claim 11 wherein, again utilizing said patterned layer of resist material as an etch-mask, said titanium nitride and platinum layers are patterned in a dry-etching step.

13. A method as in claim 12 wherein, still utilizing said patterned layer of resist material as an etch-mask, said continuous layer of titanium is then patterned in a wetetching step, and wherein the patterned layer of resist material is then removed, thereby leaving on said substrate defined conductive patterns each comprising, from bottom to top, layers of titanium, titanium nitride, platinum and gold.

14. A method as in claim 1 wherein said substrate includes a non-planar v-grooved top surface, and wherein the bottoms of v-grooves in said top surface are rounded and widened during the partial etching of said layer of silicon dioxide.

* * * * *